United States Patent
Perez et al.

(10) Patent No.: US 11,701,883 B2
(45) Date of Patent: Jul. 18, 2023

(54) INKJET PRINTHEAD HAVING ROBUST ENCAPSULATION OF WIREBONDS

(71) Applicant: Memjet Technology Limited, Dublin (IE)

(72) Inventors: Elmer Dimaculangan Perez, North Ryde (AU); See-Huat Tan, North Ryde (AU); Glenn Horrocks, North Ryde (AU); Mohammad Hossain, North Ryde (AU); Michael John Webb, North Ryde (AU); Pascal Blanquer, North Ryde (AU); Erik Coolen, North Ryde (AU)

(73) Assignee: Memjet Technology Limited, Dublin (IE)

( * ) Notice: Subject to any disclaimer, the term of this patent is extended or adjusted under 35 U.S.C. 154(b) by 146 days.

(21) Appl. No.: 17/399,818

(22) Filed: Aug. 11, 2021

(65) Prior Publication Data

US 2022/0048289 A1    Feb. 17, 2022

Related U.S. Application Data

(60) Provisional application No. 63/065,329, filed on Aug. 13, 2020.

(51) Int. Cl.
*B41J 2/14*        (2006.01)

(52) U.S. Cl.
CPC .. *B41J 2/14016* (2013.01); *B41J 2002/14362* (2013.01); *B41J 2002/14491* (2013.01); *B41J 2202/19* (2013.01); *B41J 2202/22* (2013.01)

(58) Field of Classification Search
CPC .......... B41J 2/14016; B41J 2002/14362; B41J 2002/14491; B41J 2202/19; B41J 2202/22
See application file for complete search history.

(56) References Cited

U.S. PATENT DOCUMENTS

2010/0075466 A1\* 3/2010 Chew ........................ B41J 2/16
257/E21.001

\* cited by examiner

*Primary Examiner* — Thinh H Nguyen
(74) *Attorney, Agent, or Firm* — Cooley LLP

(57) ABSTRACT

An electronic assembly includes a substrate having a die and PCB mounted thereon. Wirebonds interconnect bond pads of the die with contact pads of the PCB, each wirebond having a first end portion bonded to a respective bond pad, an opposite second end portion bonded to a respective contact pad and an intermediate section extending between the first and second end portions. A dam encapsulant encapsulates each of the first and second end portions, a first fill encapsulant contacts the substrate and the dam encapsulant; and a second fill encapsulant overlies the first fill encapsulant. The first fill encapsulant has a lower modulus of elasticity than the second fill encapsulant and the dam encapsulant.

17 Claims, 4 Drawing Sheets

INKJET PRINTHEAD HAVING ROBUST ENCAPSULATION OF WIREBONDS

CROSS REFERENCE TO RELATED APPLICATIONS

This application claims priority to and the benefit of U.S. Provisional Patent Application No. 63/065,329, filed on Aug. 13, 2020, the disclosure of which is incorporated herein by reference in its entirety for all purposes.

FIELD OF THE INVENTION

This invention relates to encapsulation of wirebonds, particularly in inkjet printheads having one more printhead dies connected to a PCB. It has been developed primarily to provide robust chemical and mechanical protection of wirebonds whilst minimizing thermo-mechanical stresses that may lead to issues, such as die-cracking.

BACKGROUND OF THE INVENTION

The Applicant has previously described methods for encapsulation of wirebonds in inkjet printheads. For example, as described in U.S. Pat. No. 8,063,318 (the contents of which are incorporated herein by reference) wirebonds connecting contact pads on a printhead chip (or "printhead die") and a PCB may be encapsulated using a combination of 'dam' encapsulant beads covering contacts pads at opposite ends of the wirebonds and a 'fill' encapsulant, which encapsulates wirebonds extending therebetween. As described in U.S. Pat. No. 8,063,318, the dam encapsulant has a relatively higher modulus of elasticity than the fill encapsulant, which provides sufficient control of mechanical stresses to avoid wirebond damage during thermal expansion/contraction of the printhead.

U.S. Pat. No. 10,442,200 (the contents of which are incorporated herein by reference) describes a printhead having a plurality of printhead dies attached to a metal alloy manifold via a metal alloy (e.g. Invar) shim Such printheads have been designed for use with pigment-based inks and, further, enable construction of relatively long printheads, such as A3 pagewide printheads.

As foreshadowed above, the primary function of a wirebond encapsulant in an inkjet printhead is to protect wirebonds from ink. If the encapsulant is breached and ink contacts the wirebonds, then the printhead will fail due to electrical shorting. However, it is equally important that the encapsulant itself does not introduce thermo-mechanical stresses in the printhead that can lead to wirebond fracture or die-cracking, either during manufacturing or during normal use via thermal cycling.

Relatively harder encapsulant materials—that is, encapsulant materials having a relatively high modulus of elasticity—are generally preferable in terms of mechanical and chemical robustness, particularly towards aggressive cosolvents and surfactants found in certain inkjet inks. For pigment-based inks used with the printheads described in U.S. Pat. No. 10,442,200, relatively harder encapsulant materials have been found to be necessary to avoid chemical attack. On the other hand, those relatively harder materials have a greater tendency to introduce undesirable thermo-mechanical stresses in the printhead. In particular, the printheads described in U.S. Pat. No. 10,442,200 are quite susceptible to die-cracking during manufacture when a relatively harder 'fill' encapsulant is used. This is understood to be a result of the mechanical linkage provided by the encapsulant material between the dies and the PCB.

It would therefore be desirable to provide a wirebond encapsulant, which is resistant to chemical attack whilst minimizing thermo-mechanical stresses in the printhead, which may cause die-cracking.

SUMMARY OF THE INVENTION

An electronic assembly comprising:
a substrate;
one or more dies mounted on the substrate, each die having a plurality of bond pads;
a PCB mounted on the substrate, the PCB having a plurality of contact pads;
a plurality of wirebonds interconnecting the bond pads and the contact pads, each wirebond having a first end portion bonded to a respective bond pad, an opposite second end portion bonded to a respective contact pad and an intermediate section extending between the first and second end portions;
a dam encapsulant encapsulating each of the first and second end portions, the bond pads and the contact pads;
a first fill encapsulant disposed on the substrate so as to contact at least the substrate and the dam encapsulant; and
a second fill encapsulant disposed on the first encapsulant so as to contact at least the first fill encapsulant and the dam encapsulant;
wherein:
the second fill encapsulant does not contact the substrate;
at least one of the first and second fill encapsulants encapsulates the intermediate sections of the wirebonds; and
the first fill encapsulant has a lower modulus of elasticity than the second fill encapsulant and the dam encapsulant.

The electronic assembly according to the first aspect advantageously provides robust protection of the wirebonds whilst minimizing thermo-mechanical stresses that potentially lead to die-cracking or wirebond fracture. In particular, a relatively harder second fill encapsulant provides a mechanically robust and chemically-resistant outer layer while a relatively softer first fill encapsulant weakens the mechanical linkage between the dies and the PCB, such that die-cracking either during manufacture or during normal use is minimized. While the dies and the PCB are not fully mechanically decoupled, the relatively softer first fill encapsulant is sufficient to minimize thermo-mechanical stresses to the extent that die-cracking becomes non-problematic.

Preferably, the electronic assembly is a printhead and the dies are printhead chips, such as MEMS printhead chips.

Preferably, the substrate is an ink manifold for delivering ink to the printhead chips. The ink manifold may be comprised of, for example, a polymer such as liquid crystal polymer or a metal, such as Invar.

Preferably, the printhead chips are mounted on the substrate via an intervening shim. The shim may, for example, take the form of a double-sided adhesive tape having opposite layers of adhesive disposed on a polymer support, as described in U.S. Pat. No. 7,347,534, the contents of which are incorporated herein by reference. Alternatively, the shim may take the form of, for example, a film (e.g. a metal alloy film) adhesively bonded to the substrate, as described in U.S. Pat. No. 10,442,200. Typically, the shim has ink throughholes defined therein for delivering ink from the ink manifold to the printhead chips.

Typically, the PCB is mounted directly on the substrate, for example, via adhesive bonding. The substrate may have a stepped mounting surface for accommodating the PCB.

Preferably, the dam encapsulant is configured as perimeter wall having a pair of opposite longer walls covering the contacts pads and the bond pads, respectively, and a pair of shorter walls interconnecting the longer walls at each end thereof.

Preferably, the first and second fill encapsulants are disposed within the perimeter wall, such that the dam encapsulant dams a flow of the first and second fill encapsulants during liquid deposition thereof.

Preferably, the second fill encapsulant is relatively more resistant to chemical attack than the first fill encapsulant.

Preferably, the first fill encapsulant has a modulus of elasticity in the range of 20 to 200 MPa, or preferably 50 to 150 MPa.

Preferably, the second fill encapsulant has a modulus of elasticity in the range of 500 to 3000 MPa, or preferably 700 to 2000 MPa.

Preferably, the dam encapsulant has a modulus of elasticity in the range of 500 to 3000 MPa, or preferably 700 to 2000 MPa. The second fill encapsulant and the dam encapsulant may be comprised of a same or different materials.

Typically, the dam encapsulant, the first fill encapsulant and the second fill encapsulant are each comprised of epoxy resins. Epoxy resin encapsulants having different moduli of elasticity are commercially available from various suppliers (e.g. ResinLab, Chase Corporation, Engineering Materials Systems, Inc. etc.) and will be well known to the person skilled in the art.

In a related aspect, there is provided a method of encapsulating wirebonds in an electronic assembly, the electronic assembly having:
a substrate;
one or more dies mounted on the substrate, each die having a plurality of bond pads;
a PCB mounted on the substrate, the PCB having a plurality of contact pads; and
a plurality of wirebonds interconnecting the bond pads and the contact pads, each wirebond having a first end portion bonded to a respective bond pad, an opposite second end portion bonded to a respective contact pad and an intermediate section extending between the first and second end portions,
wherein said method comprises the steps of:
depositing a dam encapsulant over each of the first and second end portions, the bond pads and the contact pads;
curing the dam encapsulant
depositing a first fill encapsulant so as to contact at least the substrate and the dam encapsulant;
curing the first fill encapsulant;
depositing a second fill encapsulant over the first fill encapsulant so as to contact the first fill encapsulant and the dam encapsulant; and
curing the second fill encapsulant
wherein:
the second fill encapsulant does not contact the substrate;
at least one of the first and second fill encapsulants encapsulates the intermediate sections of the wirebonds; and
the first fill encapsulant has a lower modulus of elasticity than the second fill encapsulant and the dam encapsulant.

As used herein, the term "modulus of elasticity" refers to the modulus of elasticity of an encapsulant material at 25 degrees centigrade after being fully cured.

As used herein, the term "PCB" is taken to mean a printed circuit board of the type having a non-conductive substrate and one or more conductive tracks carrying electrical signals. The non-conductive substrate may be flexible or rigid. The PCB may comprise additional electronic components (e.g. capacitors, resistors etc.) or, alternatively, the PCB may be absent any additional electronic components and serve only to carry electrical signals via its conductive tracks.

As used herein, the term "ink" is taken to mean any printing fluid, which may be printed from an inkjet printhead. The ink may or may not contain a colorant. Accordingly, the term "ink" may include conventional dye-based or pigment-based inks, infrared inks, fixatives (e.g. pre-coats and finishers), 3D printing fluids (e.g. binder fluids), biological fluids, functional fluids (e.g. sensor inks, solar inks etc.) and the like. Where reference is made to fluids or printing fluids, this is not intended to limit the meaning of "ink" herein.

As used herein, the term "mounted" includes both direct mounting and indirect mounting via an intervening part.

BRIEF DESCRIPTION OF THE DRAWINGS

Embodiments of the present invention will now be described by way of example only with reference to the accompanying drawings, in which.

DETAILED DESCRIPTION OF THE INVENTION

The present invention relates to an electronic assembly in its most general form. In one preferred embodiment, the electronic assembly takes the form of an inkjet printhead, which is described in detail hereinbelow.

Figure 1:
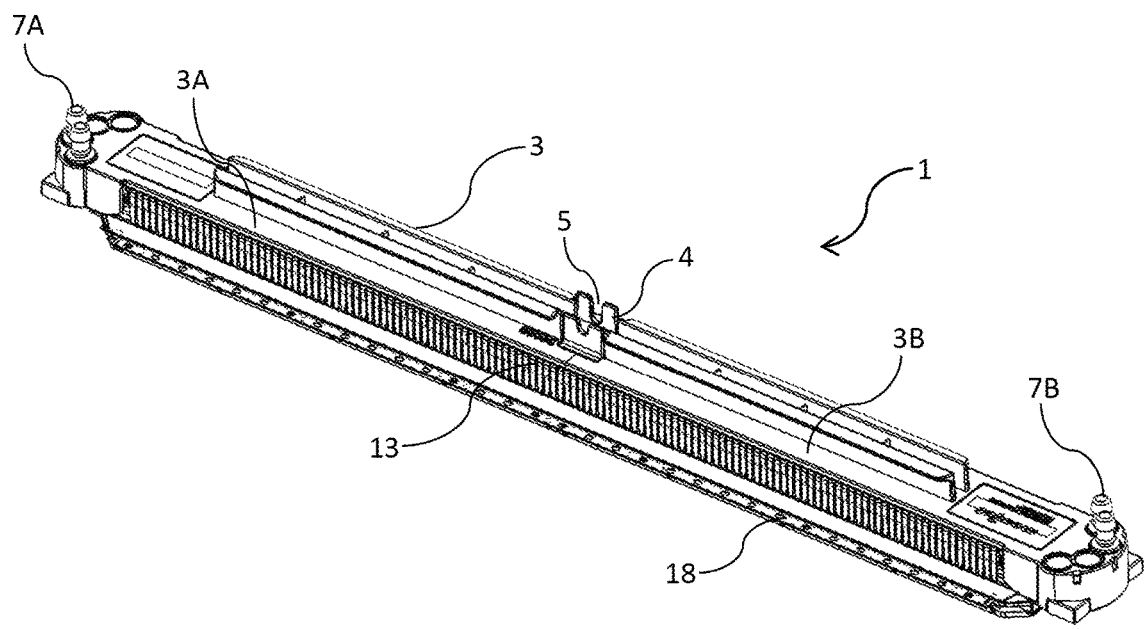
FIG. 1 is a front perspective view of an inkjet printhead.
Figure 2:
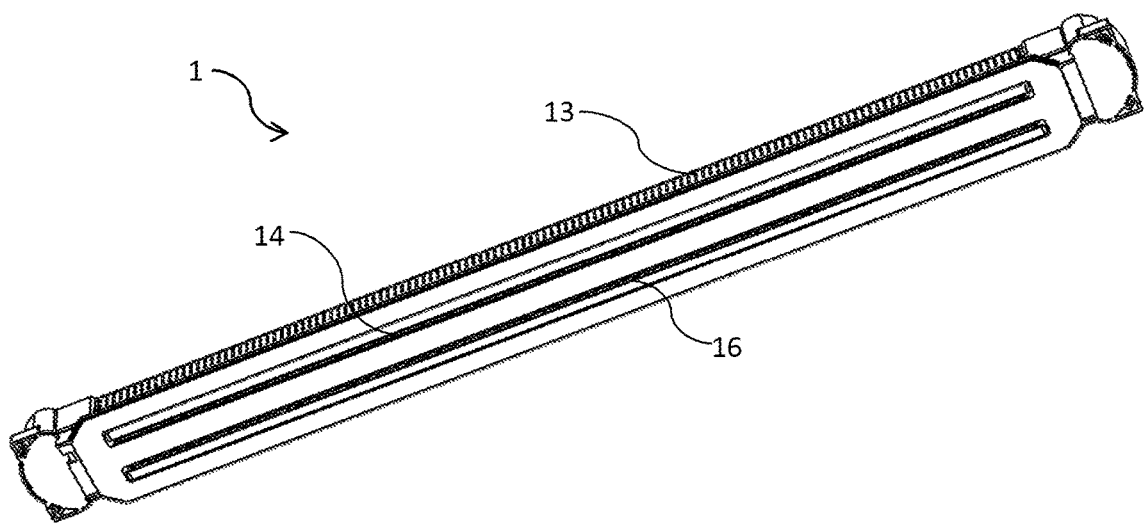
FIG. 2 is a bottom perspective of the printhead.
Figure 3:
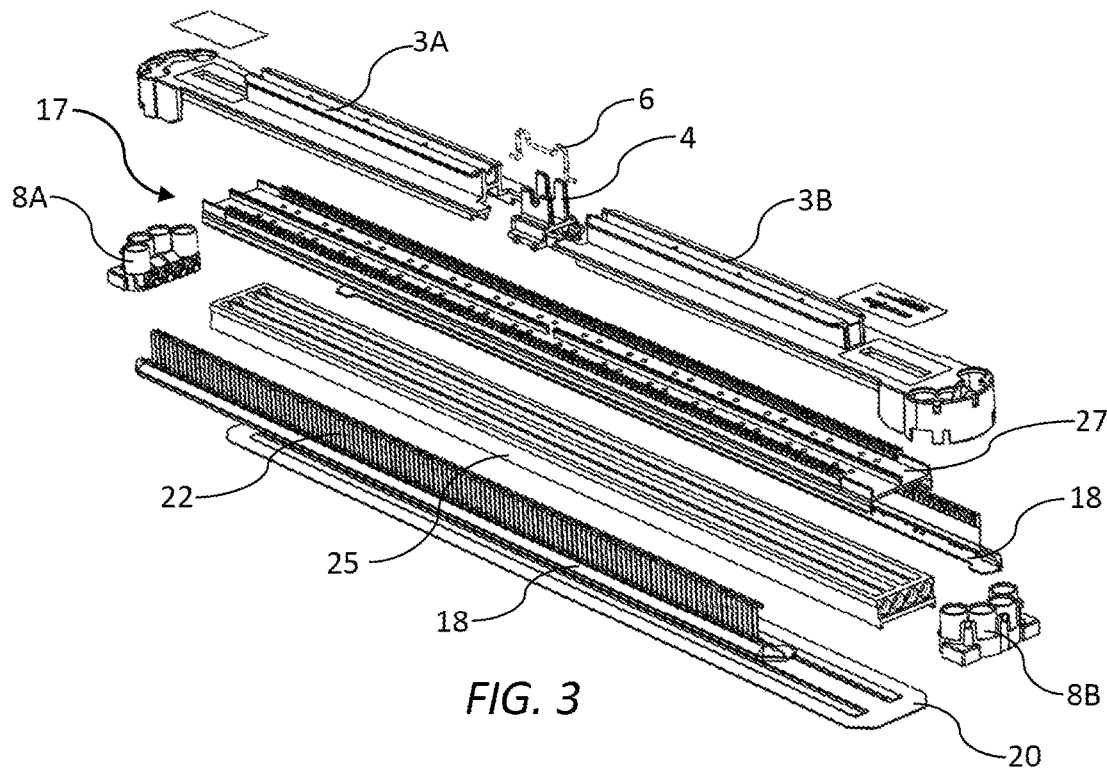
FIG. 3 is an exploded perspective of the printhead.

Referring to FIGS. 1 to 3, there is shown an inkjet printhead 1, as described in U.S. Pat. No. 10,442,200, the contents of which are incorporated herein by reference. The printhead 1 comprises an elongate molded plastics casing 3 with ink connectors at each end thereof. Inlet connectors 7A of a multi-channel inlet coupling 8A protrude upwards through openings at one end of the casing 3; and outlet connectors 7B of a multichannel outlet coupling 8B protrude upwards through an opening at an opposite end of the casing (only two inlet connectors and two outlet connectors shown in FIG. 1). The inlet and outlet connectors 7A and 7B are configured for coupling with complementary fluid couplings (not shown) supplying ink to and from the printhead.

The casing 3 has a first part 3A and a second part 3B positioned at either side of a central locator 4, the first and second casing parts 3A and 3B being biased towards each other and the central locator 4 by means of a spring clip 6 engaged therebetween. The two-part casing 3 in combination with the spring clip 6 enables the casing to expand longitudinally, at least to some extent, to accommodate a degree of longitudinal expansion in a main body 17 of the printhead 1.

The printhead 1 receives power and data signals via opposite rows of electrical contacts 13, which extend along respective sidewalls of the printhead. The electrical contacts 13 are configured to receive power and data signals from complementary contacts of a printer (not shown) or print module and deliver the power and data to printhead chips 70 via respective PCBs 18, as will be explained in more detail below.

As shown in FIG. 2, the printhead 1 comprises a first row 14 and a second row 16 of printhead chips 70 for printing onto print media (not shown) passing beneath the printhead. Each row of printhead chips is configured for printing two colors of ink, such that the printhead 1 is a full color pagewide printhead capable of printing four ink colors (CMYK) redundantly. The printhead 1 is generally symmetrical about a longitudinal plane bisecting the first row 14 and the second row 16 of printhead chips, notwithstanding the different ink colors in the printhead during use.

In the exploded perspective shown in FIG. 3, it can be seen that a main body 17 forms a rigid core of the printhead 1 for mounting various other components. In particular, the casing 3 is snap-fitted to an upper part of the main body 17; the inlet and outlet couplings 8A and 8B (enshrouded by the casing 3) are connected to opposite ends of the main body; a pair of PCBs 18 are attached to a lower part of the main body (which are in turn covered by a shield plate 20); and a plurality of leads 22 (which define the electrical contacts 13) are mounted to opposite sidewalls of the main body.

The main body 17 is a two-part machined structure comprising an elongate ink manifold 25 and a complementary cover plate 27. The ink manifold 25 functions as a carrier substrate having a unitary lower surface for mounting the first and second rows 14 and 16 of printhead chips 70 as well as respective PCBs 18. The manifold 25 and cover plate 27 are formed of a metal alloy material (e.g. Invar) having relatively high stiffness and a relatively low coefficient of thermal expansion. In combination, the manifold 25 and cover plate 27 provide a stiff, rigid structure at the core of the printhead 1 with minimal expansion along its longitudinal axis. As foreshadowed above, the casing 3 is configured so as not to constrain any longitudinal expansion of the main body 17 and thereby minimizes bowing of the printhead during use. Accordingly, the printhead 1 may be provided as an A4-length printhead or an A3-length printhead.

Figure 4:
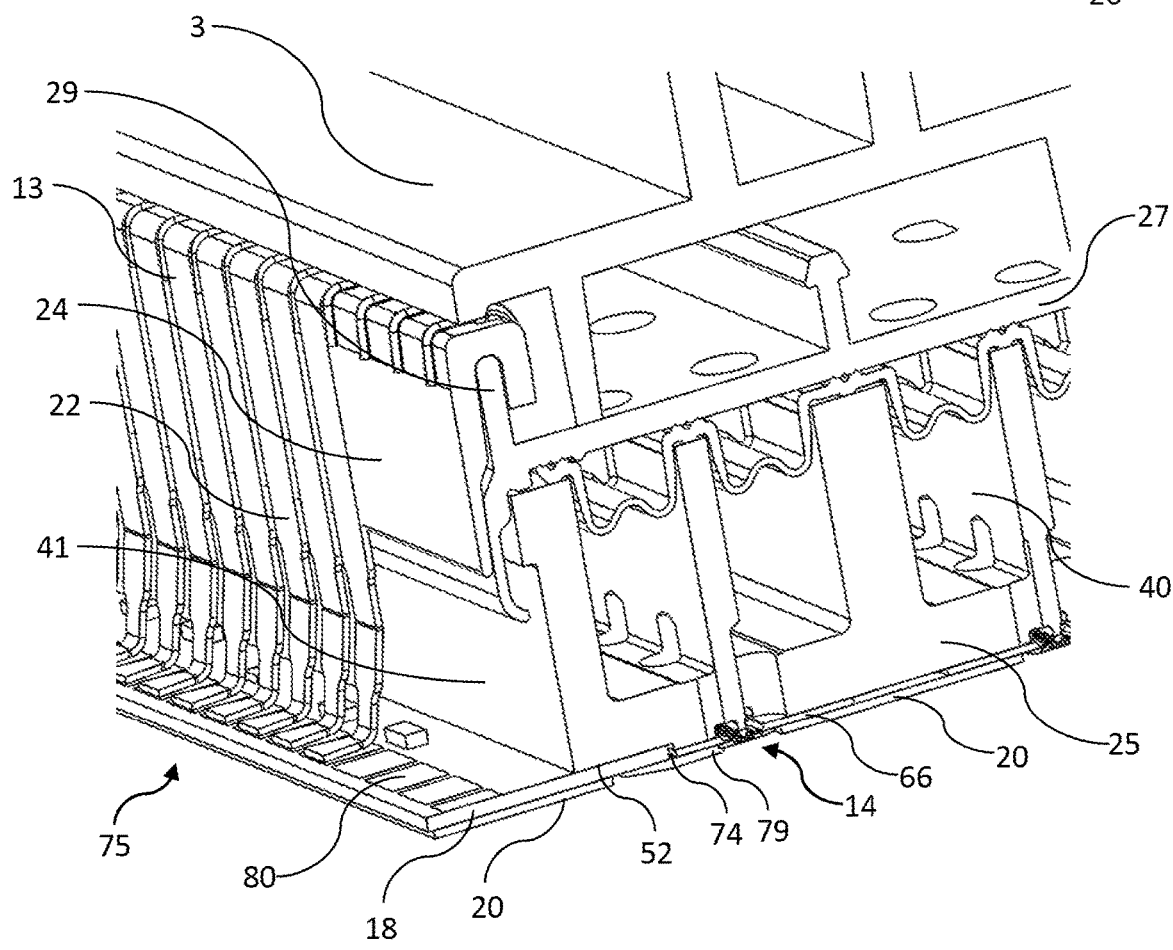
FIG. 4 is a magnified cross-sectional perspective of the part of the printhead.

Referring to FIG. 4, an Invar shim 66 is adhesively bonded to a lower surface 52 of the manifold 25 and a plurality of printhead chips 70, arranged in the first and second rows 14 and 16, are adhesively bonded to the shim 66 (only the first row 14 of printhead chips visible in FIG. 4). Each row of printhead chips 70 receives ink from longitudinal ink supply channels 40 defined in the manifold 25 via through-holes in the shim 66.

A pair of longitudinal PCBs 18 flank the first row 14 and second row 16 of printhead chips 70 at opposite sides thereof, each PCB being bonded to the lower surface 52 of the manifold 25. Each PCB 18 comprises a rigid substrate (e.g. FR-4 substrate) for mounting of various electronics components and has one edge butting against a step 74 defined in the lower surface 52 of the manifold 25. Each PCB 18 extends laterally outwards beyond sidewalls 41 of the manifold 25. A shield plate 20 is bonded to a lower surface of each PCB 18 and surrounds the first and second rows 14 and 16 of printhead chips 70 as well as a central longitudinal region between the first and second rows. The protruding portions of each PCB 18 and the shield plate 20 define opposite wings 75 of the printhead 1, while a uniformly planar lower surface of the shield plate 20 is configured for engagement with a perimeter capper (not shown) surrounding both rows of printhead chips.

Figure 5:
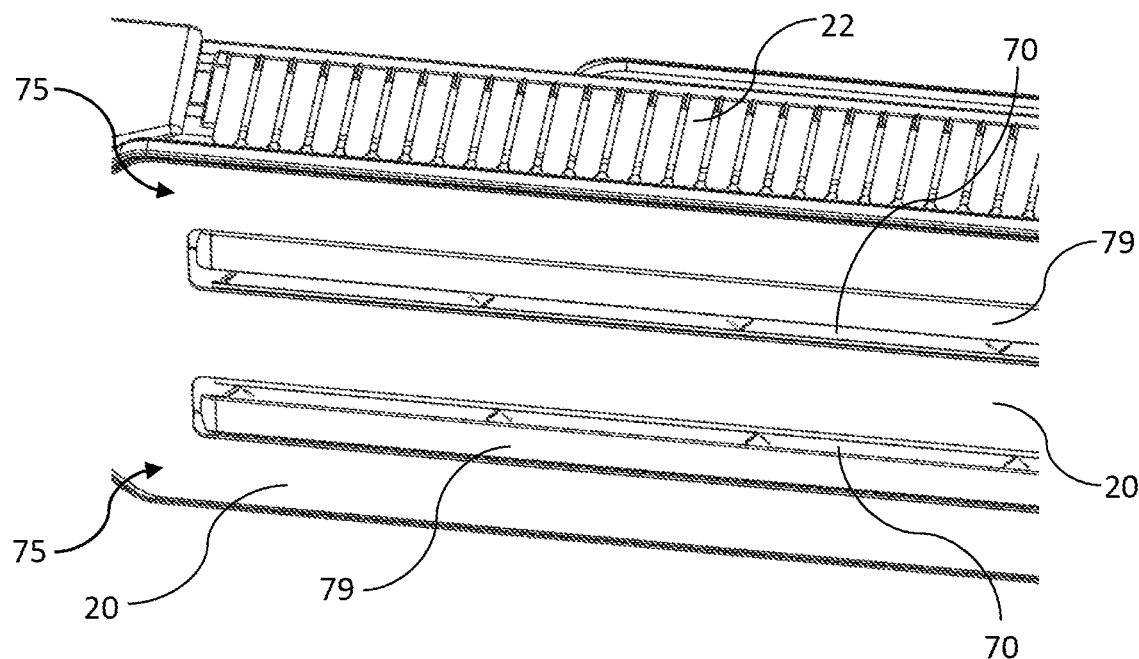
FIG. 5 is a bottom perspective of part of the printhead.
Figure 6:
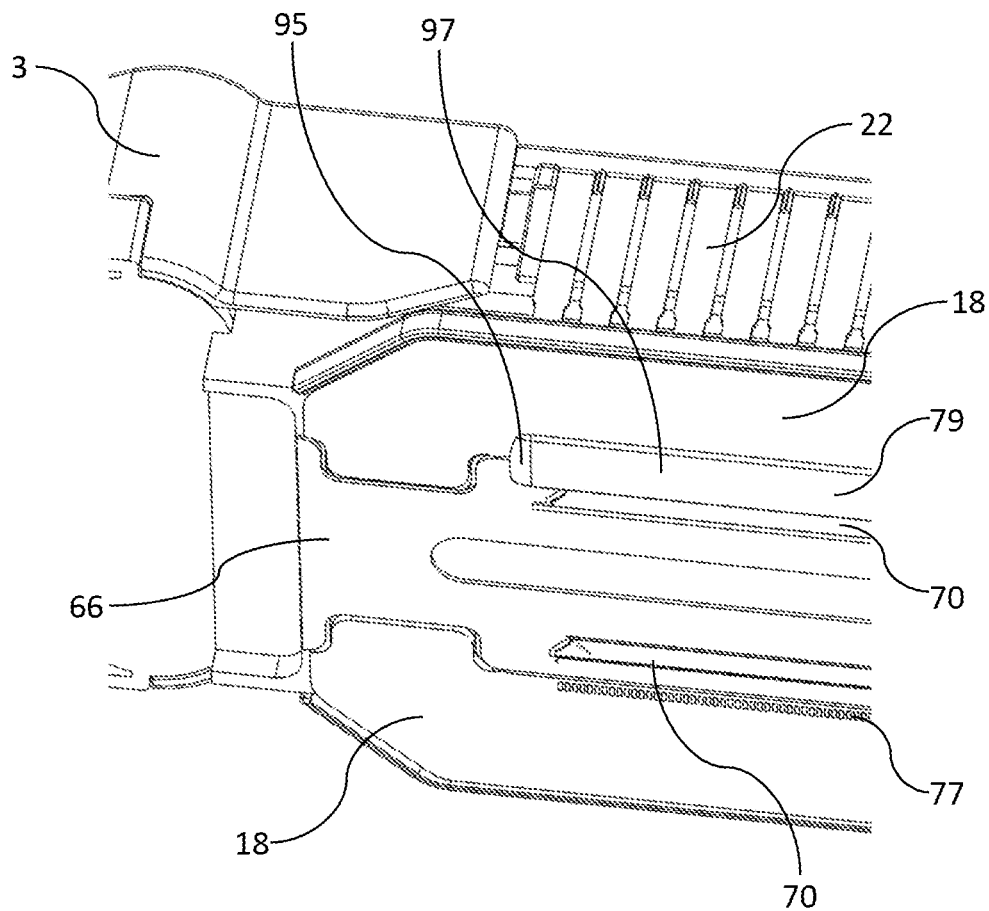
FIG. 6 is a magnified bottom perspective of the printhead with a shield plate and encapsulant removed for one row of printhead chips.

Still referring to FIG. 4, a row of connection pads 80 extends longitudinally along a distal edge portion of an upper surface of each PCB 18. Each lead 22 has one end connected to a connection pad 80 and extends upwardly towards a respective sidewall of the main body 17. The leads 22 have an upper portion mounted to a respective flange 29 of the cover plate 27 via a lead retainer 24 affixed thereto, and a lower portion which flares laterally outwards towards the connection pads 80. Each lead 22 also has a portion defining the electrical contact 13 for connection to external power and data connectors of a printer Referring now to FIGS. 5 and 6, an edge of each PCB 18 proximal a respective row of printhead chips 70 has a respective row of pinouts in the form of contact pads 77. Each contact pad 77 is connected to a respective bond pad 73 on one of the printhead chips via a wirebond connection (not visible in FIGS. 5 and 6). In this way, each row of printhead chips 70 receives power and data from the electricals contacts 13 via the leads 22 and a respective PCB 18 adjacent the row of printhead chips.

The wirebonds are protected by an encapsulant package 79, which extends between the proximal edge of each PCB 18 containing the contact pads 77 and an proximal edge of the printhead chips 70 containing the bond pads 73. As foreshadowed above, it is essential that the encapsulant package 79 provides robust protection of the wirebonds, particularly with respect to chemical attack from high pH inks, which typically contain aggressive cosolvents and surfactants.

Figure 7:
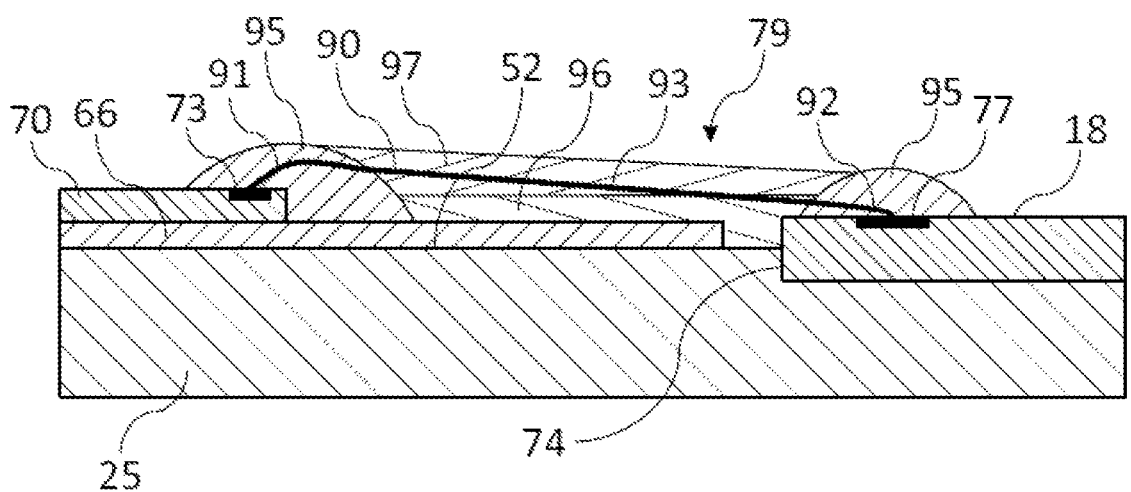
FIG. 7 is a schematic side sectional view of a connection region between a printhead chip and a PCB.

FIG. 7 shows schematically a side sectional view of a connection region of the PCB 18 and the printhead chip 70, in accordance with the present invention. The printhead chip 70, having a longitudinal row of bond pads 73, is mounted on a lower surface 52 of the ink manifold 25 via the intervening shim 66. The PCB 18 having contact pads 77 is directly mounted on the lower surface 52 of the ink manifold 25 adjacent the printhead chip 70 and received in the stepped portion 74 of the lower surface. A wirebond 90 interconnects the bond pad 73 and the contact pad 77. The wirebond 90 has a first end portion 91 bonded to the bond pad 73, an opposite second end portion 92 bonded to the contact pad 77 and an intermediate section 93 extending between the first and second end portions.

The encapsulant package 79 protects the wirebond 90, as well as the bonds pads 73 and contact pads 77, and comprises three components: (1) a bead of dam encapsulant 95 extending longitudinally along the row of bond pads 73 and the row of contact pads 77, which forms an endless perimeter dam via transverse interconnecting portions at each longitudinal end thereof; (2) a first fill encapsulant 96 having a relatively low modulus of elasticity disposed within the perimeter of dam encapsulant 95 on the lower surface the ink manifold 25 and an exposed portion of the shim 66; and (3) a second fill encapsulant 97 having a relatively higher modulus of elasticity disposed on the first fill encapsulant 96 within the perimeter of dam encapsulant. The dam encapsulant 95 encapsulates the first and second end portions 91 and 92 of the wirebond 90 as well as the bond pads 73 and contact pads 77, while the first and second fill encapsulants 96 and 97 together encapsulate the intermediate section 93 of the wirebond.

Importantly, the second fill encapsulant 97 does not contact the ink manifold 25, which serves as a common supporting substrate for the printhead chips 70 and the PCB 18. This has the effect of reducing the mechanical linkage between the printhead chip 70 and the PCB 18 via the encapsulant package 79. Since only the first fill encapsulant 96, having a relatively lower modulus of elasticity, is in contact with the ink manifold 25 then any mechanical stresses invoked via thermal expansion of the ink manifold are minimized. On the other hand, the relatively harder second fill encapsulant 97 provides a robust outer surface, which is resistant to chemical attack as well as providing a mechanically robust protective layer. Therefore, the encapsulant package 79 significantly improves die packaging in harsh environments subject to thermo-mechanical stresses and chemical attack, such as those found in inkjet printheads.

In practice, it has been found that the intermediate section 93 of the wirebond 90 may be encapsulated within the first fill encapsulant 96, the second fill encapsulant 97 or, as shown in FIG. 7, both the first and second fill encapsulants. With the relatively softer first fill encapsulant 96, thermo-mechanical stresses in the connection region are minimized, and fracturing of wirebonds is minimized regardless of whether of the first or second fill encapsulant encapsulates the wirebonds 90.

An exemplary method for manufacturing an electronic assembly in accordance with the present invention comprises the steps of: (1) forming wirebond connections between the bond pads of the die (e.g. printhead chip 70) and contact pads of the PCB (e.g. PCB 18); (2) dispensing a bead of dam encapsulant over the bond pads and contact pads and forming a perimeter wall; (3) curing the dam encapsulant using UV and/or thermal curing; (4) dispensing the first fill encapsulant and flowing within the perimeter wall of dam encapsulant; (5) curing the first fill encapsulant using UV and/or thermal curing; (6) dispensing the second fill encapsulant and flowing within the perimeter wall of dam encapsulant; and (7) curing the second fill encapsulant using UV and/or thermal curing.

It will, of course, be appreciated that the present invention has been described by way of example only and that modifications of detail may be made within the scope of the invention, which is defined in the accompanying claims.

The invention claimed is:

1. An electronic assembly comprising:
   a substrate;
   one or more dies mounted on the substrate, each die having a plurality of bond pads;
   a PCB mounted on the substrate, the PCB having a plurality of contact pads;
   a plurality of wirebonds interconnecting the bond pads and the contact pads, each wirebond having a first end portion bonded to a respective bond pad, an opposite second end portion bonded to a respective contact pad and an intermediate section extending between the first and second end portions;
   a dam encapsulant encapsulating each of the first and second end portions, the bond pads and the contact pads;
   a first fill encapsulant disposed on the substrate so as to contact at least the substrate and the dam encapsulant; and
   a second fill encapsulant disposed on the first fill encapsulant so as to contact at least the first fill encapsulant and the dam encapsulant;
   wherein:
   the second fill encapsulant does not contact the substrate;
   at least one of the first and second fill encapsulants encapsulates the intermediate sections of the wirebonds; and
   the first fill encapsulant has a lower modulus of elasticity than the second fill encapsulant and the dam encapsulant.

2. The electronic assembly of claim 1, wherein the dies are printhead chips and the electronic assembly is a printhead.

3. The electronic assembly of claim 2, wherein the substrate is an ink manifold for delivering ink to the printhead chips.

4. The electronic assembly of claim 3, wherein the printhead chips are mounted on the substrate via an intervening shim.

5. The electronic assembly of claim 4, wherein the shim comprises a metal alloy film.

6. The electronic assembly of claim 4, wherein the PCB is mounted directly on the substrate.

7. The electronic assembly of claim 1, wherein the dam encapsulant is configured as an endless perimeter wall having a pair of opposite longer walls covering the contacts pads and the bond pads, respectively, and a pair of shorter walls interconnecting the longer walls at each end thereof.

8. The electronic assembly of claim 7, wherein the first and second fill encapsulants are disposed within the perimeter wall, such that the dam encapsulant dams a flow of the first and second fill encapsulants during liquid deposition thereof.

9. The electronic assembly of claim 8, wherein the second fill encapsulant is relatively more resistant to chemical attack than the first fill encapsulant.

10. The electronic assembly of claim 1, wherein the first fill encapsulant has a modulus of elasticity in the range of 20 to 200 MPa.

11. The electronic assembly of claim 1, wherein the second fill encapsulant has a modulus of elasticity in the range of 500 to 3000 MPa.

12. The electronic assembly of claim 1, wherein the dam encapsulant has a modulus of elasticity in the range of 500 to 3000 MPa.

13. The electronic assembly of claim 1, wherein the dam encapsulant, the first fill encapsulant and the second fill encapsulant are each comprised of a material selected from the group consisting of epoxy resins.

14. A method of encapsulating wirebonds in an electronic assembly, the electronic assembly having:
   a substrate;
   one or more dies mounted on the substrate, each die having a plurality of bond pads;
   a PCB mounted on the substrate, the PCB having a plurality of contact pads; and
   a plurality of wirebonds interconnecting the bond pads and the contact pads, each wirebond having a first end portion bonded to a respective bond pad, an opposite second end portion bonded to a respective contact pad and an intermediate section extending between the first and second end portions,
   wherein said method comprises the steps of:
   depositing a dam encapsulant over each of the first and second end portions, the bond pads and the contact pads;
   curing the dam encapsulant
   depositing a first fill encapsulant so as to contact at least the substrate and the dam encapsulant;
   curing the first fill encapsulant;
   depositing a second fill encapsulant over the first fill encapsulant so as to contact the first fill encapsulant and the dam encapsulant; and
   curing the second fill encapsulant
   wherein:
   the second fill encapsulant does not contact the substrate;

at least one of the first and second fill encapsulants encapsulates the intermediate sections of the wirebonds; and the first fill encapsulant has a lower modulus of elasticity than the second fill encapsulant and the dam encapsulant.

15. The method of claim 14, wherein each curing step is selected from the group consisting of: thermal curing and UV curing.

16. The method of claim 14, wherein the dam encapsulant is deposited as an endless perimeter wall having a pair of opposite longer walls covering the contacts pads and the bond pads, respectively, and a pair of shorter walls interconnecting the longer walls at each end thereof.

17. The method of claim 16, wherein the first and second fill encapsulants are disposed within the perimeter wall, and wherein the dam encapsulant dams a flow of the first and second fill encapsulants during respective depositions thereof.

\* \* \* \* \*